(12) United States Patent
Yuan et al.

(10) Patent No.: US 12,191,211 B2
(45) Date of Patent: Jan. 7, 2025

(54) METHOD FOR MAKING SEMICONDUCTOR DEVICE USING A STRESS MEMORIZATION TECHNIQUE

(71) Applicant: United Semiconductor (Xiamen) Co., Ltd., Fujian (CN)

(72) Inventors: Linshan Yuan, Shamen (CN); Guang Yang, Fujian (CN); Yuchun Guo, Shamen (CN); Jinjian Ouyang, Fujian (CN); Chin-Chun Huang, Hsinchu County (TW); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 468 days.

(21) Appl. No.: 17/752,869

(22) Filed: May 25, 2022

(65) Prior Publication Data
US 2023/0352347 A1    Nov. 2, 2023

(30) Foreign Application Priority Data

Apr. 29, 2022    (CN) .......................... 202210472495.2

(51) Int. Cl.
*H01L 21/8238*    (2006.01)
*H01L 27/092*    (2006.01)

(52) U.S. Cl.
CPC .... *H01L 21/823871* (2013.01); *H01L 27/092* (2013.01)

(58) Field of Classification Search
CPC ..... H01L 21/823418; H01L 21/823871; H01L 27/092; H01L 29/7847
USPC .......................................................... 438/938
See application file for complete search history.

(56) References Cited

U.S. PATENT DOCUMENTS

2023/0064376 A1*    3/2023    Ho ..................... H01L 29/7847

* cited by examiner

*Primary Examiner* — Hoai V Pham
(74) *Attorney, Agent, or Firm* — Winston Hsu

(57) ABSTRACT

A method for fabricating a semiconductor device is disclosed. A substrate having thereon at least one metal-oxide-semiconductor (MOS) transistor is provided. A stress memorization technique (SMT) process is performed. The SMT process includes steps of depositing an SMT film covering the at least one MOS transistor on the substrate, and subjecting the SMT film to a thermal process. A lithographic process and an etching process are performed to form a patterned SMT film. A silicide layer is formed on the MOS transistor. The patterned SMT film acts as a salicide block layer when forming the silicide layer.

7 Claims, 4 Drawing Sheets

METHOD FOR MAKING SEMICONDUCTOR DEVICE USING A STRESS MEMORIZATION TECHNIQUE

BACKGROUND OF THE INVENTION

1. Field of the Invention

The present invention relates to the field of semiconductor technology, in particular to a stress memorization technology (SMT) process.

2. Description of the Prior Art

It is known that stress memorization technology (SMT) is usually performed after the source/drain (S/D) ion implantation step in the semiconductor process to induce stress on the channel area of a metal-oxide-semiconductor field effect transistor (MOSFET).

In the conventional SMT process, a stress layer and laser annealing are usually used to induce stress in the substrate, that is, the polysilicon gate under the stress layer is recrystallized by laser annealing to improve the electrical properties of the N-channel MOSFET (NMOSFET, hereinafter referred to as NMOS). The aforementioned stress layer is removed before the subsequent self-aligned silicidation process.

During the self-aligned metal silicide process, it is necessary to deposit a salicide block (SAB) layer, such as a silicon oxide layer and a silicon nitride layer. Exposure and development processes are performed to pattern the SAB layer to mask the area where the silicide layer is not needed (non-silicide region). However, the above-mentioned SMT process and self-aligned metal silicide process require multiple depositions and etchings, and the steps are relatively complicated.

SUMMARY OF THE INVENTION

It is one object of the present invention to provide an improved manufacturing method of a semiconductor device to solve the above-mentioned deficiencies or shortcomings of the prior art.

One aspect of the invention provides a method for fabricating a semiconductor device. A substrate having thereon at least one metal-oxide-semiconductor (MOS) transistor is provided. A stress memorization technique (SMT) process is performed. An SMT film covering the at least one MOS transistor is deposited on the substrate. The SMT film is then subjected to a thermal process. After the SMT process, a lithographic process and an etching process are performed to form a patterned SMT film. A silicide layer is then formed on the MOS transistor. The patterned SMT film acts as a salicide block layer when forming the silicide layer.

According to some embodiments, the at least one MOS transistor is an NMOS transistor.

According to some embodiments, the SMT film comprises a silicon oxide layer and a silicon nitride layer.

According to some embodiments, the silicon nitride layer is a stressed silicon nitride layer.

According to some embodiments, the patterned SMT film covers a non-silicide region on the substrate that does not need to form a silicide layer.

According to some embodiments, the thermal process comprises a rapid thermal process.

According to some embodiments, the thermal process comprises a laser annealing process.

One advantage of the present invention is that the patterned SMT film is used as a self-aligned silicide block layer when forming the silicide layers. Therefore, the SMT film removal step, the subsequent cleaning step, and the additional steps of depositing and patterning of a self-alignment silicide block layer can be omitted. The present invention can effectively reduce the complexity and manufacturing cost of the steps of manufacturing the semiconductor device.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
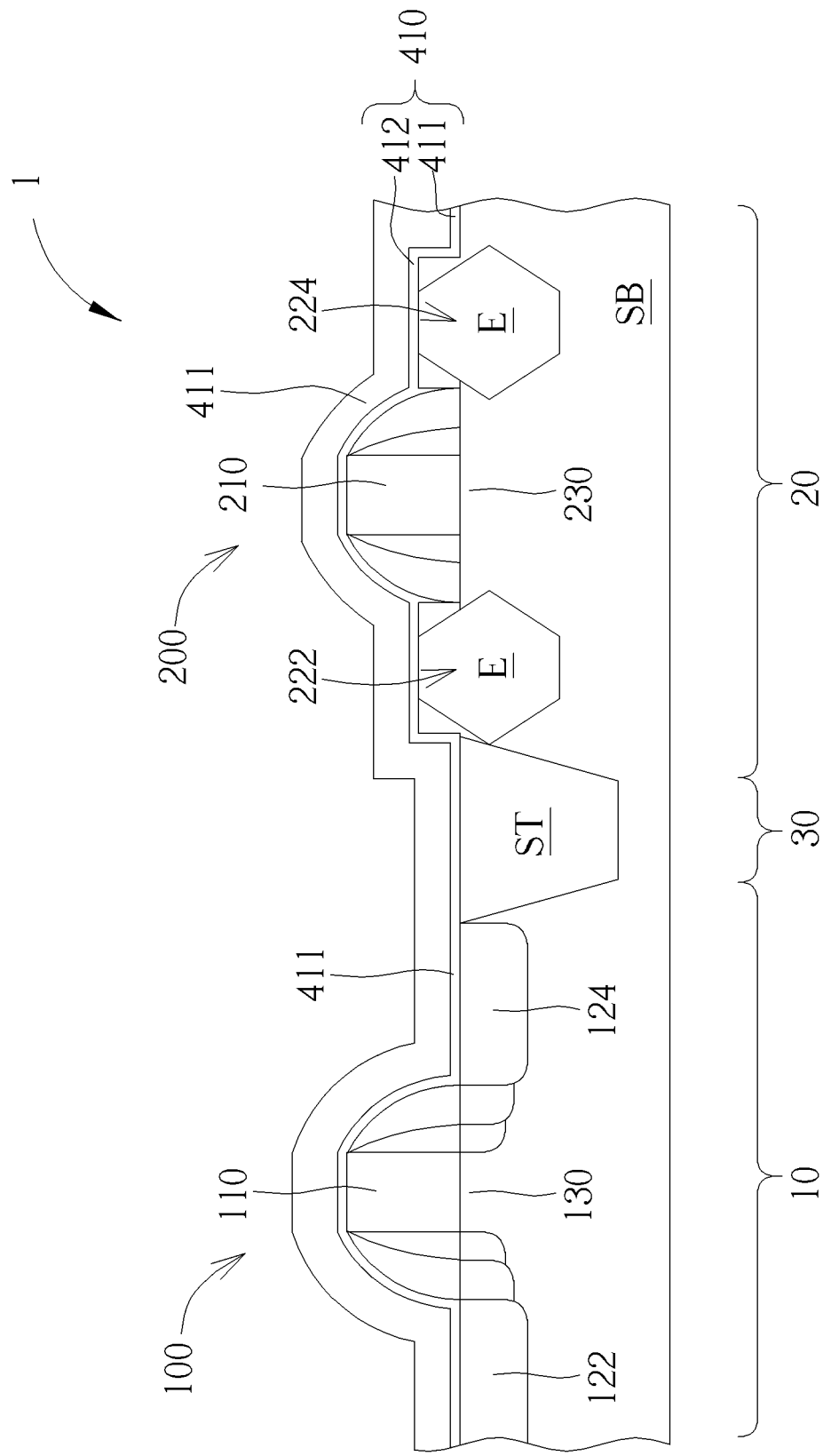
FIG. 1 to FIG. 4 are schematic diagrams illustrating a method for manufacturing a semiconductor device according to an embodiment of the present invention.

Please refer to FIG. 1 to FIG. 4, which are schematic diagrams of a method for manufacturing a semiconductor device 1 according to an embodiment of the present invention. First, as shown in FIG. 1, a substrate SB such as a semiconductor substrate is provided. The substrate SB includes a first device region 10, a second device region 20, and an isolation region 30 interposed between the first device region 10 and the second device region 20. A first semiconductor device 100 is formed in the first device region 10 on the substrate SB, and a second semiconductor device 200 is formed in the second device region 20.

According to an embodiment of the present invention, a trench isolation structure ST located in the isolation region 30 can electrically isolate the first semiconductor device 100 from the second semiconductor device 200.

According to an embodiment of the present invention, for example, the first semiconductor device 100 and the second semiconductor device 200 are metal oxide semiconductor (MOS) transistors. According to an embodiment of the present invention, for example, the first semiconductor device 100 is an NMOS transistor, and the second semiconductor device 200 is a PMOS transistor.

According to an embodiment of the present invention, for example, the first semiconductor device 100 may include a gate 110, a source 122, and a drain 124. A channel 130 is disposed between the source 122 and the drain 124. According to an embodiment of the present invention, for example, the second semiconductor device 200 may include a gate 210, a source 222, and a drain 224. A channel 230 is disposed between the source 222 and the drain 224. According to embodiments of the present invention, for example, the gates 110 and 210 may be polysilicon gates.

In addition, according to an embodiment of the present invention, a SiGe epitaxial layer E may be included in the source 222 and the drain 224.

Next, a stress memorization technology (SMT) process is performed, including depositing an SMT film 410 covering the first semiconductor device 100 and the second semiconductor device 200 on the substrate SB. According to an embodiment of the present invention, the SMT film 410 includes a silicon oxide layer 411 and a silicon nitride layer 412. According to an embodiment of the present invention, the silicon nitride layer 412 is a stressed silicon nitride layer.

Figure 2:
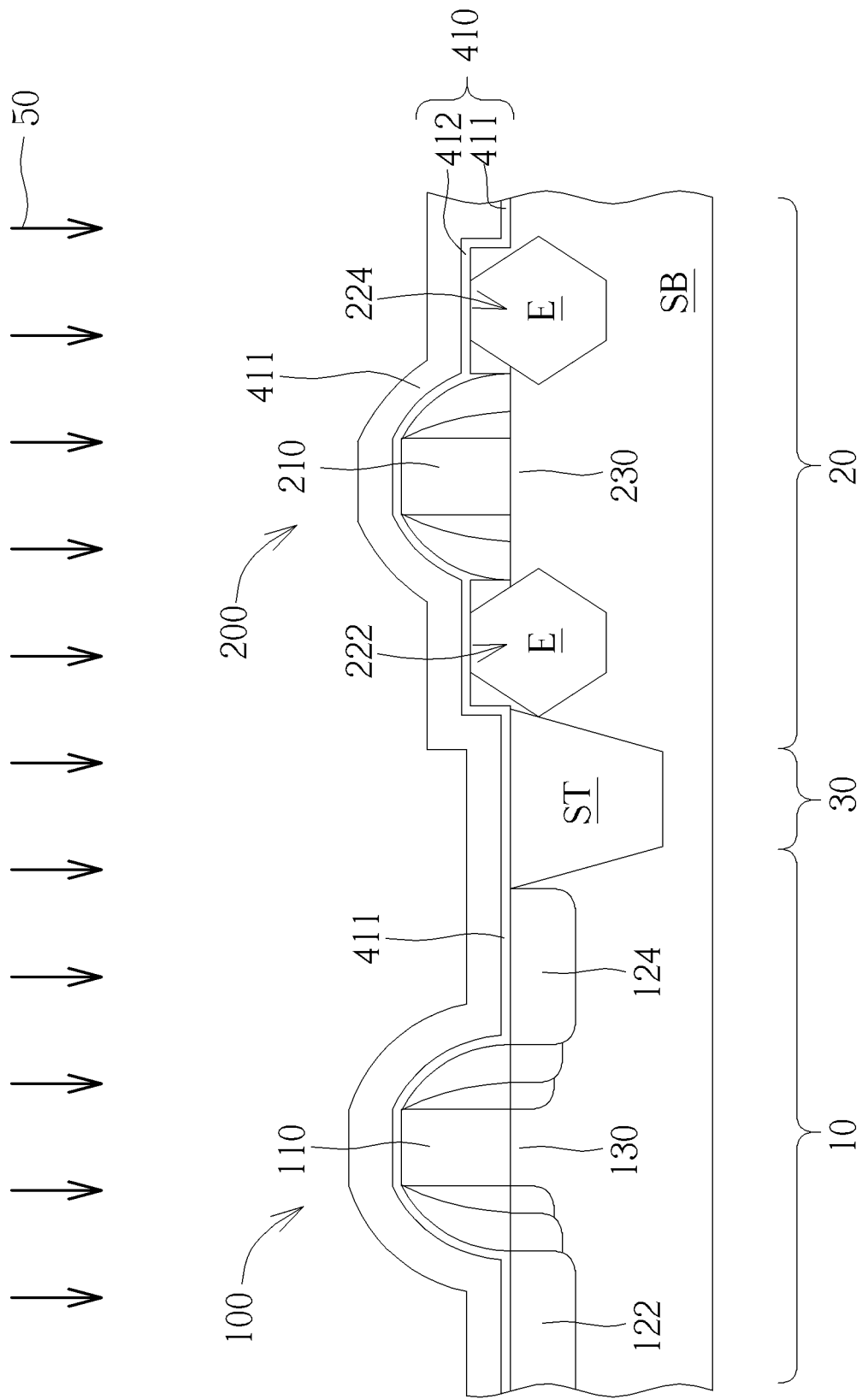

As shown in FIG. 2, the SMT film 410 is next subjected to thermal treatment 50. According to an embodiment of the present invention, the thermal treatment 50 may include a rapid thermal process. According to an embodiment of the present invention, the thermal treatment 50 may include a laser annealing process. The polysilicon gate 110 under the SMT film 410 is recrystallized by the laser annealing, thereby improving the electrical performance of the NMOS transistor.

Figure 3:
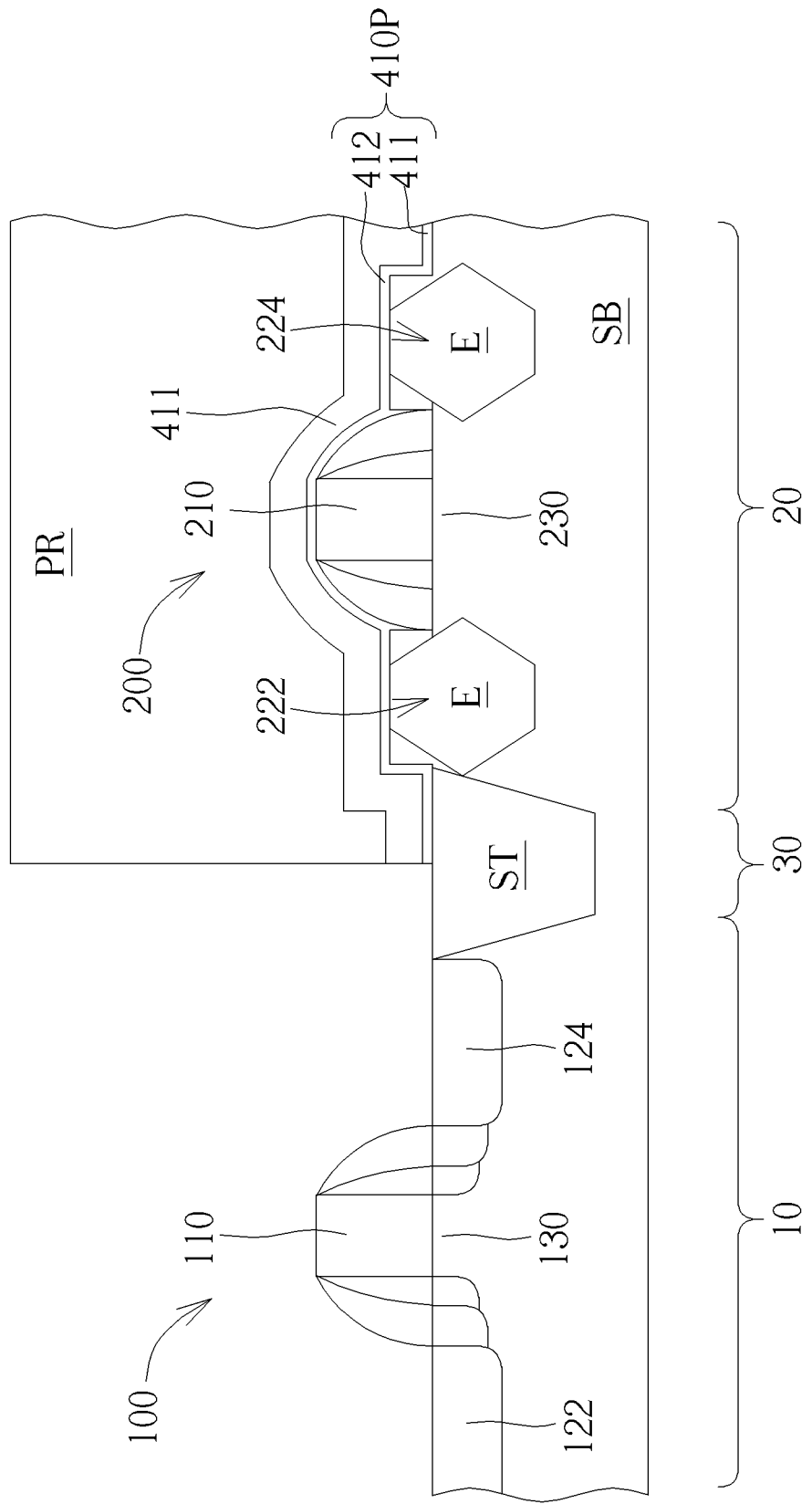

As shown in FIG. 3, after the SMT process is completed, a photolithographic process is performed to form a photoresist pattern PR on the SMT film 410, and then an etching process is used to remove the SMT film 410 not covered by the photoresist pattern PR to form a patterned SMT film 410P. According to an embodiment of the present invention, the patterned SMT film 410P covers the non-silicide region of the substrate SB that does not need to form a silicide layer. Subsequently, the photoresist pattern PR is removed.

Figure 4:
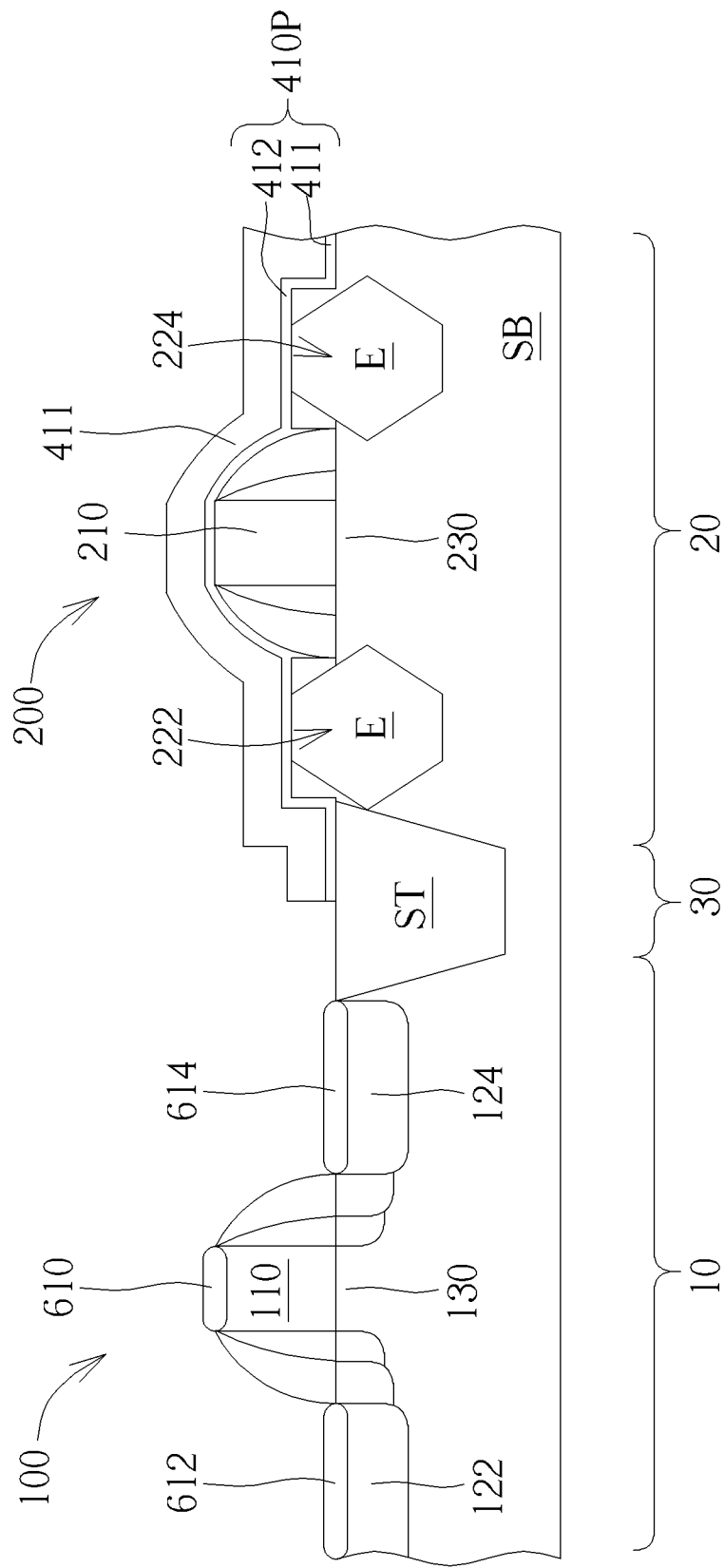

As shown in FIG. 4, subsequently, on the regions not covered by the patterned SMT film 410P, for example, on the gate 110, the source 122 and the drain 124 of the first semiconductor device 100, a silicide layer 610 and a silicide layer 612 and a silicide layer 614 are respectively formed. The patterned SMT film 410P acts as a salicide block layer when forming the silicide layer 610, the silicide layer 612 and the silicide layer 614.

One advantage of the present invention is that the patterned SMT film 410P is used as a self-aligned silicide block layer when forming the silicide layer 610, the silicide layer 612 and the silicide layer 614. Therefore, the SMT film removal step, the subsequent cleaning steps after removing the SMT film as well as the step of depositing and patterning the salicide barrier layer can be omitted, which effectively reduces the complexity and manufacturing cost of the steps of fabricating the semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a substrate having thereon at least one metal-oxide-semiconductor (MOS) transistor;
   performing a stress memorization technique (SMT) process comprising depositing an SMT film covering the at least one MOS transistor on the substrate, and subjecting the SMT film to a thermal process;
   after the SMT process, performing a lithographic process and an etching process to form a patterned SMT film; and
   forming a silicide layer on the MOS transistor, wherein the patterned SMT film acts as a salicide block layer when forming the silicide layer.

2. The method according to claim 1, wherein the at least one MOS transistor is an NMOS transistor.

3. The method according to claim 1, wherein the SMT film comprises a silicon oxide layer and a silicon nitride layer.

4. The method according to claim 3, wherein the silicon nitride layer is a stressed silicon nitride layer.

5. The method according to claim 1, wherein the patterned SMT film covers a non-silicide region on the substrate that does not need to form a silicide layer.

6. The method according to claim 1, wherein the thermal process comprises a rapid thermal process.

7. The method according to claim 1, wherein the thermal process comprises a laser annealing process.

* * * * *